(12) United States Patent
Richardson et al.

(10) Patent No.: US 7,783,792 B2
(45) Date of Patent: Aug. 24, 2010

(54) ENCLOSURE SLOT IDENTIFICATION BY MODULES

(75) Inventors: Thomas Richardson, Golden, CO (US); Mohamad El-Batal, Westminster, CO (US)

(73) Assignee: LSI Corporation, Milpitas, CA (US)

( * ) Notice: Subject to any disclaimer, the term of this patent is extended or adjusted under 35 U.S.C. 154(b) by 724 days.

(21) Appl. No.: 10/783,785

(22) Filed: Feb. 20, 2004

(65) Prior Publication Data

US 2005/0188118 A1 Aug. 25, 2005

(51) Int. Cl.
*G06F 3/00* (2006.01)
(52) U.S. Cl. .......................................... 710/16
(58) Field of Classification Search .............. 710/9, 710/16, 63, 300; 361/687
See application file for complete search history.

(56) References Cited

U.S. PATENT DOCUMENTS

| | | | | |
|---|---|---|---|---|
| 4,781,066 A | * | 11/1988 | Pope et al. | 73/239 |
| 5,748,912 A | * | 5/1998 | Lee | 710/301 |
| 5,809,330 A | * | 9/1998 | Ninomiya | 710/9 |
| 6,029,211 A | * | 2/2000 | Nakashima | 710/14 |
| 6,182,204 B1 | * | 1/2001 | Nakashima | 712/38 |
| 2004/0100765 A1 | * | 5/2004 | Crippen et al. | 361/687 |

* cited by examiner

*Primary Examiner*—Tariq Hafiz
*Assistant Examiner*—Aurangzeb Hassan
(74) *Attorney, Agent, or Firm*—Samuel M. Freund; Cochran Freund & Young LLC

(57) ABSTRACT

An apparatus and method for enabling a circuit board or data storage module located within a slot in an enclosure to determine the identification of the slot by detecting a characteristic feature of the slot. In this manner the circuit board or data storage module can be instructed to operate in accordance with the function of that slot. This is important when a plurality of slots having different functions contains identical circuit boards or modules.

18 Claims, 2 Drawing Sheets

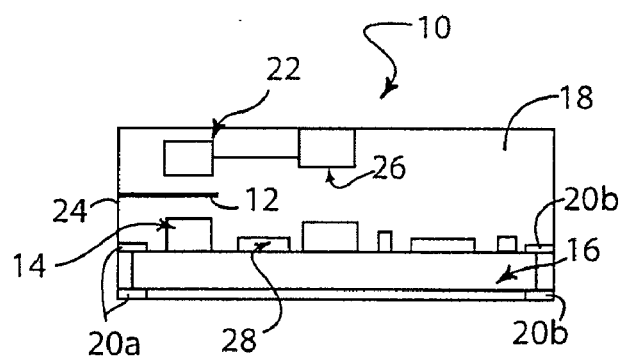
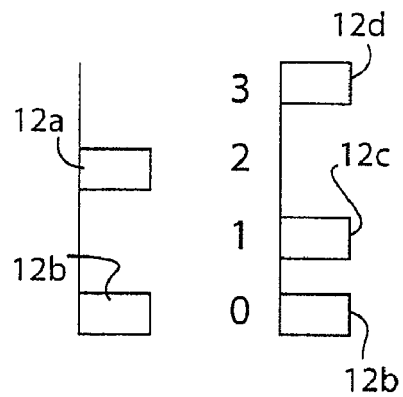
FIGURE 1A  FIGURE 2
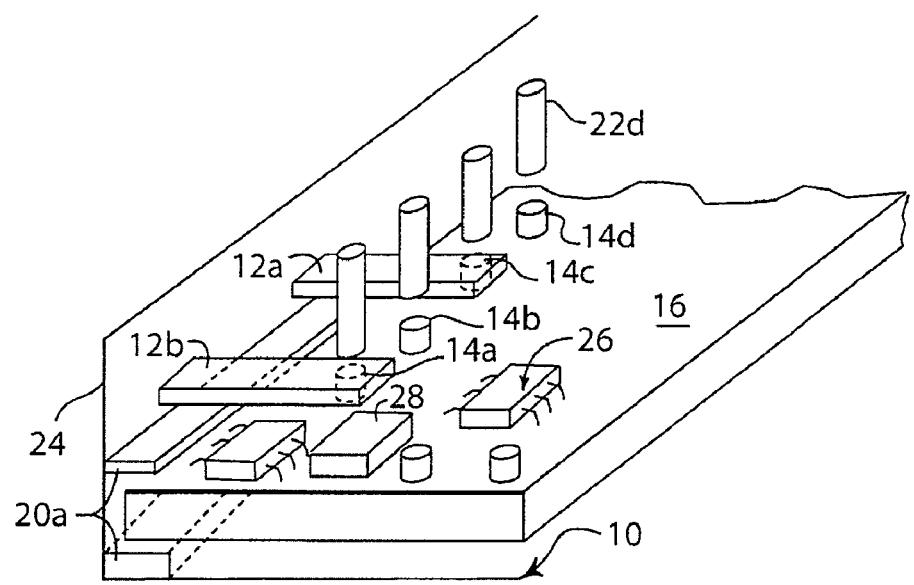
FIGURE 1B

ENCLOSURE SLOT IDENTIFICATION BY MODULES

FIELD OF THE INVENTION

The present invention relates generally to enclosures for electrical modules or cards and, more particularly, to an apparatus and method wherein the modules identify the slots in which they are inserted.

BACKGROUND OF THE INVENTION

It is often necessary to determine the location of an electronic module or circuit board, or a data storage module in a plurality of slots of an enclosure, such as a storage array enclosure, in which the module or circuit board is installed. For example, several slots or locations may hold identical modules having different functions within the system of such modules. Among the reasons for using identical modules are cost savings, and a reduction in the error rate associated with introducing an incorrect module into a bin which appears to be identical to other slots. Such modules are referred to as customer replaceable units (CRUs) or field replaceable units (FRUs). In order that a particular module operate in accordance with its desired function within a group of modules, the module needs to "know" in which slot it has been placed. Once its location is identified, pre-programmed circuitry in the module can perform properly. A similar situation exists for data storage modules within a storage array enclosure.

Existing solutions to this problem rely on a number of electrical pins having been reserved for this purpose in the electrical connector for a specific slot or bin, and sensed by the inserted CRUs and FRUs. However, with increasing complexity of functions for current CRUs and FRUs is such that there are insufficient uncommitted connection pins available for the specific function of slot location analysis.

Accordingly, it is an object of the present invention to provide a method and apparatus such that an electronic module or data storage module can determine in which slot it has been located and establish its particular function therein.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

To achieve the foregoing and other objects, and in accordance with the purposes of the present invention, as embodied and broadly described herein the apparatus for determining the function of a circuit board disposed in a slot in an enclosure and in electrical communication with the enclosure, hereof includes means located within the enclosure for displaying a characteristic of the slot; means disposed on the circuit board for detecting the characteristic of the slot; and a controller or processor for interpreting the detected characteristic and for directing the circuit board to perform the function associated therewith.

In another aspect of the invention in accordance with its objects and purposes the method for determining the function of a circuit board disposed in a slot in the interior of an enclosure and in electrical communication with the enclosure, hereof includes displaying a characteristic of the slot inside of the enclosure; detecting the displayed characteristic; interpreting the detected characteristic; and directing the circuit board to perform the function associated with the interpreted characteristic of the slot.

Benefits and advantages of the present invention include the use of circuit boards having identical electrical components, but having different functions.

BRIEF DESCRIPTION OF THE DRAWINGS

The accompanying drawings, which are incorporated in and form a part of the specification, illustrate the embodiments of the present invention and, together with the description, serve to explain the principles of the invention. In the drawings:

FIG. 1a is a schematic representation of a side view of an embodiment of the apparatus of the present invention showing an enclosure having horizontal tabs projecting into its interior in such a manner that the number and location of these tabs can be determined by tab sensing elements located on a circuit board inserted into a slot in the enclosure, while FIG. 1b is a schematic representation of a perspective view of the apparatus illustrated in FIG. 1a hereof showing a configuration of tabs being detected by tab sensing elements once the card is fully inserted into the slot.

FIG. 2 shows two examples of tab configurations, where the left configuration represents 1010 binary or 10 decimal and the right configuration represents 0100 binary and 4 decimal when read by the sensing elements.

FIG. 4a is a schematic representation of a perspective view of yet another embodiment of the invention showing a plurality of microswitches disposed on the surface of the printed circuit board in the vicinity of the pin connector, while

DETAILED DESCRIPTION

Figure 3:
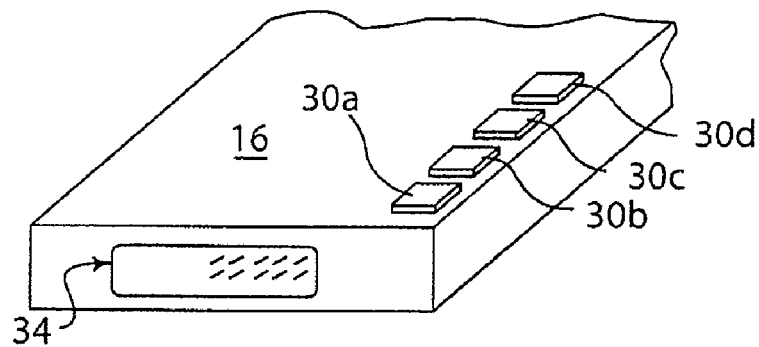
FIG. 3 is a schematic representation of a perspective view of another embodiment of the present apparatus showing sensors adapted for determining the identification of a slot in response to a signal pattern generated by the upper surface of the enclosure, and disposed in the vicinity of the pin connector of the printed circuit.

Briefly, the present invention includes an apparatus and method for enabling a circuit board or data storage module, as examples, located within a slot or bin in an enclosure to determine the identification of the slot by detecting a characteristic feature of the slot. In this manner the circuit board or data storage module can operate in accordance with the function of that slot. This is particularly important when a plurality of slots or enclosure locations contain identical modules having different functions.

In accordance with one embodiment of the present invention, each slot in an enclosure that houses multiple CRUs has a set of mechanical tabs arranged in a binary fashion. The binary representation for each slot in an enclosure is chosen such that when a CRU is placed in the slot a sensing apparatus determines the configuration of the tabs and reports the configuration to circuits or processors located on the CRU that determine the function of the CRU from this information. Thus, each CRU can identify its unique slot location within the enclosure. If a chosen CRU is moved to another location, it identifies the new location based on the mechanical binary configuration of the new slot. In this manner, CRUs can be removed for service operations such as repair or upgrading, and replacement CRUs can be inserted into the same slot with certainty of their function within the overall system.

A variety of sensors may be used to determine the presence or absence of a mechanical tab, including micro switches, Hall-effect devices, or LED sensors, or a combination of these or other devices. The number of tabs is determined by the number of slot locations to be uniquely identified.

Reference will now be made in detail to the present embodiments of the invention, examples of which are illustrated in the accompanying drawings. Similar or identical structure in the drawings will be identified by identical callouts. Turning now to the figures, FIG. 1a is a schematic representation of a side view of one embodiment of the apparatus of the present invention showing enclosure, 10, having horizontal tabs, 12, projecting into its interior in such a manner that the number and location of these tabs can be determined by tab sensing elements, 14, located on printed circuit board, 16, inserted into slot, 18, of the enclosure. Guides, 20a and 20b insure proper alignment of printed circuit board 16 in enclosure 10. In the embodiment shown in FIG. 1a, sensing element 14 includes a photodetector which detects the presence or absence of light generated by light source, 22. Light source 22 can be supported by wall, 24, of enclosure 10, the same wall which supports tabs 12, and powered by light source power supply, 26, in enclosure 10, or supported by printed circuit board 16 and powered by a light source power supply located on printed circuit board 16 (not shown in FIG. 1a). Light source 22 may be a light emitting diode, and photodetector 14 may be a photocell or a charge-coupled detector, as examples. In operation, all of the light sources would be illuminated such that light detected by sensing elements 22 depends on whether a tab 12 is blocking the pathway between light source 22 and sensing element 14. It should be mentioned that the tab can simply reduce the signal reaching the sensing element, rather than blocking it. A single charge-coupled detector might be utilized to detect the pattern. The detected light pattern is a binary representation of the identity of slot 18, and permits printed circuit board 16 to adjust its function in accordance with this pattern using controller or processor, 28, which receives the light pattern detected by sensing elements 14 and selects the operation of printed circuit board 16 in accordance therewith. As stated, and without limiting the present invention, printed circuit board 16 can be a data storage module, and enclosure 10 may include a plurality of slots 18. The function of circuit boards having identical hardware is directed by firmware responsive to the identity of the slot or bin in which the circuit board is inserted.

FIG. 1b is a schematic representation of a perspective view of the apparatus illustrated in FIG. 1a hereof showing a configuration of tabs 12a and 12b detected by tab sensing elements 14a-14d once card 16 is fully inserted into slot 18. Clearly, tabs 12 can be fabricated from any material which substantially reduces the transmission of light therethrough. Other examples of sensing elements for detecting the presence of absence of tabs include Hall-effect sensors responsive to electric currents impressed on circuits located on printed circuit board 16, or on a wall of enclosure 10, where the magnitude of the effect is altered by an intervening tab. Microswitches responsive to projections on the wall of the enclosure adapted to depress such switches can also be used to accomplish the purposes of the present invention.

FIG. 2 shows two examples of configurations for tabs 12, where the configuration including tabs 12a and 12b represent 1010 binary or 10 decimal, while the configuration including tabs 12b, 12c and 12d represent 0100 binary and 4 decimal when detected by sensing elements 14. It is seen that when light is detected, a 1 is recorded and when the light is blocked by a tab, a zero is recorded in these examples. Clearly, the present apparatus could be configured such that the presence of a signal blocking tab represents a 1, while its absence represents a zero.

FIG. 3 is a schematic representation of a perspective view of another embodiment of the present apparatus showing sensors 30a-30d disposed in the vicinity of the pin connector, 32, of card 16 adapted for determining the identification of a slot in response to signals generated by enclosure 10, not shown in FIG. 3. Sensors 30a-30d, can be photodetectors responsive to corresponding light emitting diodes located on the top inner surface of enclosure 10, also not shown. The pattern displayed by the light emitting diodes disposed in enclosure 10 characteristic of the binary signature of the slot is detected by photodetectors 30a-30d to provide the bin identification to card 16 for use in determining its function. Clearly, sensors 30a-30d can be located at any position on card 16 which has an unimpeded pathway to the light-emitting diodes located in enclosure 10, such that the diode light pattern impressed on the diodes can be detected thereby.

Figure 4A:
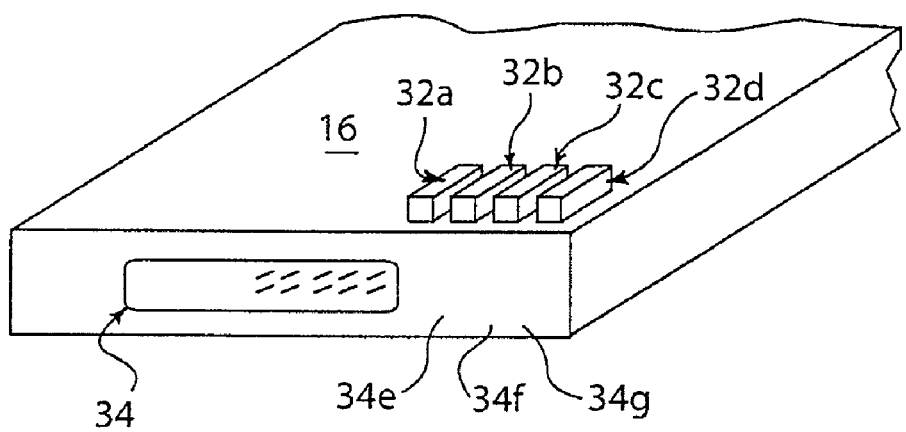
Figure 4B:
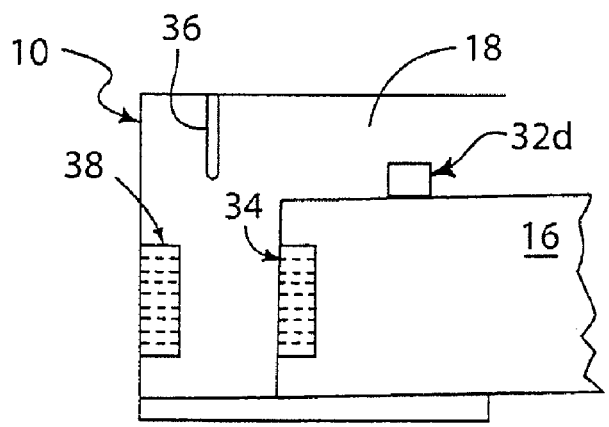
FIG. 4b is a schematic representation of a side view of the printed circuit partially inserted into a bin slot, showing projections located on the top surface of the bin corresponding to certain of the microswitches on the surface of the card, such that from the number and disposition of the matching projections and microswitches, the identification of the slot can be determined.

FIG. 4a is a schematic representation of a perspective view of yet another embodiment of the invention showing a plurality of microswitches, 32a-32d, disposed in the vicinity of pin connector 34 of printed circuit board 16, while FIG. 4b is a schematic representation of a side view of printed circuit board 16 partially inserted into slot 18 of enclosure 10, showing projections, 36, directed downward from the top inner surface of the enclosure in the vicinity of matching pin connector, 38, to connector 34 and adapted to actuate certain of the microswitches 32a-32d on printed circuit board 16. From the number and disposition of the matching projections and microswitches, the identification of the bin can be determined.

The foregoing description of the invention has been presented for purposes of illustration and description and is not intended to be exhaustive or to limit the invention to the precise form disclosed, and obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. An apparatus for determining the function of a multifunction circuit board disposed in a slot in an enclosure and in electrical communication with said enclosure, which comprises in combination:
   (a) means located within said enclosure for generating an identifying functional characteristic of the slot in a mechanical, electromagnetic or magnetic binary configuration;
   (b) means disposed on said multifunction circuit board for detecting the binary configuration of the characteristic; and
   (c) a processor disposed on said circuit board for interpreting the detected binary configuration of the characteristic and for directing said multifunction circuit board to perform that particular function of said multifunction circuit board associated with the detected characteristic.

2. The apparatus as described in claim 1, wherein said means located within said enclosure for generating a characteristic of the slot comprises means for generating at least one signal, and at least one tab disposed within the interior of the slot capable of substantially reducing the at least one signal.

3. The apparatus as described in claim 2, wherein said means disposed on said circuit board for detecting the characteristic of the slot comprises means for detecting the at least one signal.

4. The apparatus as described in claim 3, wherein said means for generating at least one signal comprises a source of light, and wherein said means for detecting the characteristic of the slot comprises at least one light detector adapted for detecting light generated from said source of light.

5. The apparatus as described in claim 4, wherein said at least one tab is disposed in a pattern characteristic of the function of the slot, and said at least one light detector, reproduces the pattern characteristic of the function of the slot.

6. The apparatus as described in claim 5, wherein the light generated from said source of light is substantially reduced by said at least one tab when said at least one tab is disposed between said source of light and said at least one light detector.

7. The apparatus as described in claim 5, wherein said at least one source of light comprises at least one light emitting diode and said at least one light detector comprises a charge-coupled detector.

8. The apparatus as described in claim 1, wherein said means for generating a characteristic of the slot comprises at least one source of light; and said means for detecting the characteristic of said slot comprises at least one light detector adapted for detecting light generated by said at least one source of light, whereby a pattern characteristic of the function of the slot is reproduced by said at least one light detector.

9. The apparatus as described in claim 8, wherein said source of light comprises at least one light emitting diode and said at least one light detector comprises a charge-coupled detector.

10. The apparatus as described in claim 1, wherein said means for detecting the characteristic of the slot comprises at least one microswitch in electrical communication with said processor, and said means for generating a characteristic of the slot comprises at least one projection positioned on a wall of said enclosure disposed in a pattern characteristic of the function of the slot and adapted to actuate one of said at least one microswitch when said circuit board is inserted into the slot, such that the characteristic of the function of the slot is sensed by said at least one microswitch.

11. The apparatus as described in claim 1, wherein said means disposed on said circuit board for detecting the characteristic of the slot comprises a Hall-effect apparatus.

12. A method for determining the function of a multifunction circuit board disposed in a slot in an enclosure, comprising the steps of:
generating an identifying characteristic of the slot in a mechanical, electromagnetic or magnetic binary configuration inside of the enclosure;
detecting the binary configuration of the displayed characteristic on the multifunction circuit board;
interpreting the binary configuration of the detected characteristic on the multifunction circuit board; and
directing the circuit board to perform that particular function of the multifunction circuit board associated with the interpreted characteristic of the slot.

13. The method as described in claim 12, wherein said step of generating a characteristic of the slot comprises generating at least one signal and blocking the at least one signal in a pattern characteristic of the function of the slot.

14. The method as described in claim 13, wherein said step of detecting the characteristic of the slot comprises detecting the at least one signal on the circuit board.

15. The method as described in claim 12, wherein said step of generating at least one signal is achieved using a source of light, said step of blocking the at least one signal is achieved using tabs disposed within the slot in a pattern characteristic of the function of the slot, and said step of detecting the at least one signal is achieved using a light detector disposed on the circuit board.

16. The method as described in claim 12, wherein said step of generating a characteristic of the slot is achieved using at least one source of light; and said step of detecting the characteristic of the slot is achieved using at least one light detector disposed on the circuit board and adapted for detecting light generated by said at least one source of light, whereby a pattern characteristic of the function of the slot is reproduced by the at least one light detector.

17. The method as described in claim 12, wherein said step of detecting the characteristic of the slot is achieved using at least one microswitch and said step of generating a characteristic of the slot is achieved using at least one projection positioned within the slot in a pattern characteristic of the function of the slot and adapted to actuate one of the at least one microswitch when the circuit board is inserted into the slot, such that the characteristic of the slot is detected by the at least one microswitch.

18. The method as described in claim 12, wherein said step of detecting the characteristic of the slot is achieved using a Hall-effect apparatus.

* * * * *